(12) United States Patent
Lampson

(10) Patent No.: US 7,135,827 B1
(45) Date of Patent: Nov. 14, 2006

(54) SAWYER MOTOR FORCER WITH INTEGRATED DRIVE ELECTRONICS

(76) Inventor: Clark E. Lampson, 54738 Bay Rd., Milton-Freewater, OR (US) 97862

( * ) Notice: Subject to any disclaimer, the term of this patent is extended or adjusted under 35 U.S.C. 154(b) by 43 days.

(21) Appl. No.: 11/106,145

(22) Filed: Apr. 13, 2005

Related U.S. Application Data

(60) Provisional application No. 60/562,740, filed on Apr. 15, 2004.

(51) Int. Cl.
H02P 7/00 (2006.01)

(52) U.S. Cl. ............ 318/135; 318/687; 318/671; 318/38

(58) Field of Classification Search ............ 318/135, 318/38, 671, 687
See application file for complete search history.

(56) References Cited

U.S. PATENT DOCUMENTS

| | | | |
|---|---|---|---|
| 3,376,578 A | 4/1968 | Sawyer | |
| 3,457,482 A | 7/1969 | Sawyer | |
| 3,836,835 A | 9/1974 | Sawyer | |
| 3,878,411 A | 4/1975 | Nocito | |
| 4,009,428 A | 2/1977 | Sawyer | |
| 4,455,512 A * | 6/1984 | Cornwell et al. | 318/135 |
| 4,507,598 A * | 3/1985 | Wakabayashi et al. | 318/687 |
| 4,823,062 A * | 4/1989 | Hoffman et al. | 318/687 |
| 4,893,071 A | 1/1990 | Miller | |
| 4,958,115 A * | 9/1990 | Miller | 318/662 |
| 5,434,504 A | 7/1995 | Hollis | |
| 5,818,039 A | 10/1998 | Lampson | |
| 5,912,541 A | 6/1999 | Bigler | |
| 6,175,169 B1 | 1/2001 | Hollis | |
| 6,522,035 B1 | 2/2003 | Smit | |

* cited by examiner

Primary Examiner—Rina Duda

(57) ABSTRACT

A digitally controlled, integrated Sawyer motor forcer consists of a rigid mechanical housing containing one or more linear motor segments, integrated control electronics, cooling means, and optional feedback sensors. The integrated control electronics include digital processing circuits, an external host communication interface, power conditioning and supply circuits, forcer phase amplifiers, input/output circuits and optional feedback sensor circuits. The integrated controller also provides control, amplifier, input/output, and sensor circuits for additional external motor axes that may be attached to the forcer as needed for specialized machines. The forcer may be operated in an open-loop mode without feedback sensors, or in a closed-loop servo mode using integrated feedback sensors of various types. Cooling means are included in the forcer to reduce the temperature rise caused by power dissipation in the forcer coils and the integrated electronic elements. The invention greatly improves the safety of both linear and planar Sawyer motor systems by enabling the use of low voltage forcer coils, and by reducing electromagnetic interference. Forcer control performance is increased while system cost and complexity is reduced. The forcer is designed to work with standard Sawyer motor platens.

20 Claims, 7 Drawing Sheets

US 7,135,827 B1

SAWYER MOTOR FORCER WITH INTEGRATED DRIVE ELECTRONICS

CROSS REFERENCE TO RELATED APPLICATIONS

Figure 1:
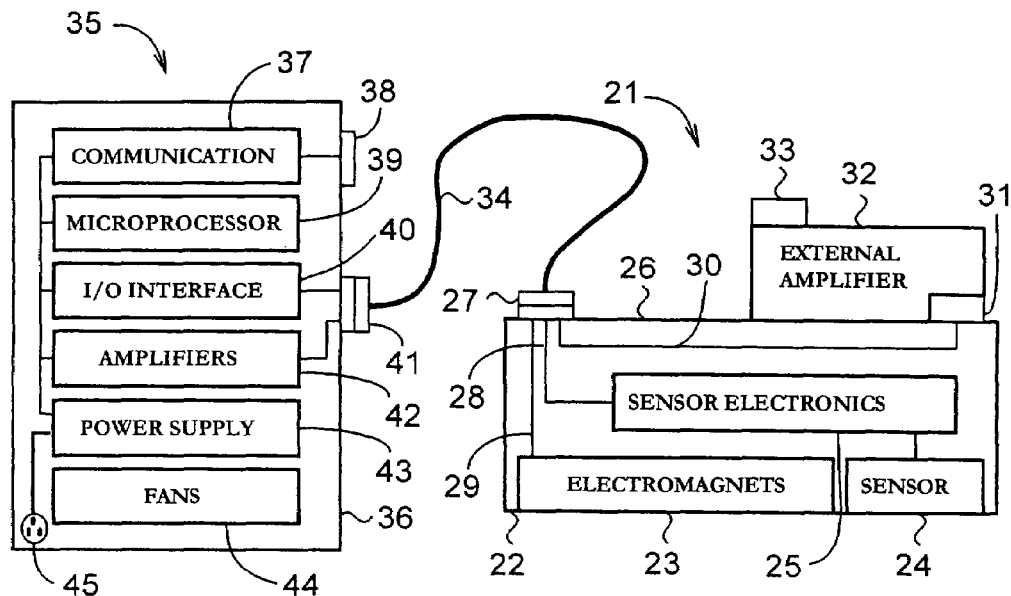

This application claims the benefit of PPA Ser. No. 60/562,740 filed Apr. 15, 2004.

FEDERALLY SPONSORED RESEARCH

None.

SEQUENCE LISTING

None.

BACKGROUND

This invention relates to a class of linear motors and their associated control and drive electronics. Well known in the art are linear motor systems of the type known as Sawyer motors after the original inventor Bruce Sawyer. These systems consist of a flat strip or sheet of magnetic material, such as electrical grade steel, with periodic grooves cut or etched in the surface forming teeth, and an opposed mechanism with toothed electromagnetic elements. The steel strip or sheet is referred to as a platen, while the electromagnetic mechanism is referred to as a forcer. The combination of a forcer, a platen, and some bearing mechanism to provide a small air-gap between the two, constitutes a complete motor.

If the Sawyer motor operates in only one direction, it is a linear motor. The platen in this case is a strip with teeth cut in a direction orthogonal to the direction of motion. The forcer for a linear motor may contain only a single set of electromagnets, although multiple sets may be used to increase force. If the Sawyer motor operates in two directions it is a planar motor. The platen in this case is a sheet with teeth cut in two orthogonal directions forming a grid of intersecting grooves. The forcer for a planar motor must contain at least two sets of electromagnets, one for each axis of motion, although more electromagnets are typically used. In the following discussion the terms "Sawyer motor" or "motor" are used to refer to a complete motor combination, the terms "Sawyer motor forcer", "Sawyer forcer" and "forcer" refer to just the electromagnetic mechanism, while the terms "Sawyer motor platen", "Sawyer platen" and "platen" refer to just the toothed magnetic sheet or strip. Unless specifically noted, these terms apply to linear or planar Sawyer devices interchangeably.

The grooves formed in both the platen surface and the forcer electromagnets, are typically filled with a strong, stable epoxy, and both the platen surface and the toothed forcer surface are ground and lapped to provide an air-bearing quality surface. The forcer is provided with a flexible cable assembly, termed an umbilical, which contains the motor coil leads and a compressed air supply tube. Passages in the forcer mechanism convey the compressed air supplied by the tube to an arraignment of small orifices or air jets, releasing the air into a thin gap which forms between the forcer and the platen in opposition to the strong magnetic attraction between these two members. Planar Sawyer motors almost universally utilize air-bearings. Linear Sawyer motors may utilize air-bearings, ball or roller bearings, or recirculating ball slide units.

Since linear and planar Sawyer motor platens are totally passive, multiple Sawyer motor forcers may be operated on a single platen, provided they are controlled to avoid collisions. An industry standard tooth pitch of 0.040" has developed, although both smaller and larger dimensions are encountered along with metric pitches. Platens and forcers are available independently from a number of vendors, and provided the tooth pitch is compatible, a forcer from one vendor will function correctly on a platen from any other vendor. While planar Sawyer motors typically incorporate an air-bearing within the forcer, this is not universal, an air-bearing may be incorporated in the platen, or a mechanical framework with air-bearings or rolling contact bearings may be used to mount the forcer in relationship to a platen. The latter approach is commonly used with linear Sawyer motors, the forcers and platens being sold without bearings, which are supplied as part of the specialized machines into which the Sawyer forcer and platen are incorporated. Thus Sawyer motor forcers, both linear and planar, are often sold independently of both platens and bearing supports, the latter objects being custom designed for particular applications, while the forcers are generally available in a small range of stock sizes offering varying force and load ratings. By analogy, rotary motors are available in so-called "open-frame" kits, which include a rotor and stator without bearings, the latter function being provided by the customer's machinery. The rotary analogy of buying only half a motor, either the stator or rotor, from one manufacturer for use with the complementary component purchased separately is lacking. In this respect, the commerce of Sawyer motors is clearly distinct from that of the more familiar rotary motors.

The invention is described in relationship to planar Sawyer motor forcers without regard to the platens. Although planar forcers are shown in all drawings and described in the detailed description and operation, the same principles may be applied to linear Sawyer motor forcers as well.

The arraignment of electromagnetic toothed elements in the planar Sawyer forcer usually consists of four independent but similar units each of which functions as a single axis linear motor referred to as a linear motor segment. Two linear motor segments typically provide motion in a first axis while being offset mechanically in the orthogonal direction, while the other two linear motor segments provide motion in the orthogonal axis while being offset mechanically in the first axis direction. Further, the mechanical placement of linear motor segments within the forcer mechanism is typically chosen to balance rotational torque about the forcer mechanism's center of mass.

The flexible umbilical connects the forcer to a remote controller that contains control processors and power amplifiers. The controller can drive the forcer in any arbitrary vector lying in the plane of the platen. A small rotation, typically +/−3 degrees, about a vector normal to the platen plane is also possible if the linear motor pairs of each axis are differentially controlled. The forcer and remote controller contain all the active elements of the system while the platen is completely passive. This allows multiple forcers to share a single platen provided they are controlled to prevent collisions.

U.S. Pat. No. 3,376,578 to Sawyer described various 3-phase variable reluctance planar motors. This patent disclosed the now classic forcer design using air-bearings with four independent linear motor segments arraigned for balanced rotational torque and balanced distribution of normal force. U.S. Pat. No. 3,457,482 to Sawyer subsequently disclosed 2-phase hybrid variable reluctance designs that incorporated permanent magnets. Next Bruce Sawyer disclosed several methods (U.S. Pat. No. 3,836,835 and U.S. Pat. No. 4,009,428) for controlling such motors with higher precision using continuously variable currents in both open-loop and closed-loop methods. An additional hybrid linear motor segment design was also disclosed wherein one permanent magnet and two coils formed a functional linear motor segment, the most compact design to date. These early patents defined the class of magnetic designs which have become known as Sawyer motors.

Nocito, et al. (U.S. Pat. No. 3,878,411) disclosed an improved linear motor segment design based on four of the previously disclosed single phase hybrid variable reluctance elements. This design spaced the hybrid variable reluctance elements in an optimal manner to form a linear motor segment capable of higher intrinsic positioning accuracy. This design is known as the 2/4-phase motor design since although four single-phase elements are used in each linear motor segment, the elements typically use coil windings coupled in a particular manner to allow 2-phase drive. Numerous variations of these early magnetic designs have been disclosed with alterations in geometry, materials, phase number, number and arraignment of linear motor segments, and construction methods. The most common systems continue to use four linear motor segments with each segment using a 2-phase or 3-phase hybrid variable reluctance design. Linear Sawyer motors typically use a single linear motor segment of the same basic designs used in planar Sawyer motors.

Most Sawyer motor systems are operated as open-loop stepper motors. In the 1990's a number of position sensor designs for planar Sawyer motors were disclosed in patents and technical publications. Miller at AT&T (U.S. Pat. No. 4,893,071) disclosed a capacitance-based sensor, Hollis, et al. at IBM (U.S. Pat. No. 5,434,504) disclosed an improved magnetic sensor, and Lampson at Yaskawa Electric America (U.S. Pat. No. 5,818,039) disclosed an optical sensor system. All of the above sensors are integrated into the forcer. Closed-loop systems using an external laser interferometer are available, but they are of limited use since they restrict the use of multiple motors on a platen, cannot deal adequately with motor rotation, and are very expensive. A number of additional patents and disclosures have been made for Sawyer motor position sensors, but the designs have not proven technically or economically viable. Linear Sawyer motors have long been operated with external linear position sensors such as are commonly available from a number of suppliers. There are typically optical or magnetic devices and have long been used on machine tools, a much larger commercial market than the linear motor market.

Electronic drive systems coupled to Sawyer forcers are microstepping drives, similar to conventional stepper motor drives. For pure variable reluctance designs, unipolar amplifiers are preferred. Hybrid variable reluctance designs use bipolar amplifiers. In the 1970's and 1980's bipolar linear amplifiers were preferred to obtain the best performance. These had very poor efficiency and were large and bulky. From the mid-1980's H-bridge pulse-width modulated (PWM) amplifiers became preferred for efficiency and cost benefits.

A disadvantage of Sawyer motors is the high total number of amplifiers required for two axes of motion. A minimum of eight H-bridge amplifiers with 16 motor phase leads is required for the standard 2-phase, four-segment forcer. Sawyer forcers are often used with platens having dimensions in the 1 to 2 meter size range, which results in umbilical lengths ranging up to 6 meters. Umbilical mass and orientation impart linear and rotational loads on the moving forcer, which degrades performance. Since the umbilical cannot be effectively shielded, the PWM amplifiers incorporate bulky, expensive and power inefficient output filters to reduce the radiated electromagnetic emissions. The limitations of current control systems and umbilical designs make it difficult to achieve safety certification.

Thus considerable time and expense has been devoted to developing controllers specifically tailored to the peculiar requirements of Sawyer motors while achieving high performance, reliability, safety and economic competitiveness. Only limited success has been achieved to date, consequently Sawyer motors have only a marginal market position.

DESCRIPTION OF PRIOR ART—FIGS. 1, 2

FIG. 1 shows the hardware components of a typical prior art forcer/controller system. A forcer 21 is connected via an umbilical cable 34 to a controller 35. Forcer 21 is a casement machined from aluminum, having a surface 22 in which a number of electromagnets 23 are attached. Surface 22 may also have an optional feedback sensor system 24 attached for measuring various parameters of motion such as acceleration, velocity, or position. A sensor electronics unit 25 provides signal conditioning and power for sensor system 24 and may be mounted inside the casement of forcer 21. An electrical cable 28 connects sensor electronics unit 25 to a connector 27. An electrical cable 29 connects forcer electromagnets 23 to connector 27.

Forcer 21 is often used in robotic or assembly applications, which may require additional motion axes. To control additional motors, an external amplifier unit 32 may be attached to forcer 21. A connector 31 provides electrical connections for amplifier unit 32. A connector 33 on amplifier 32 provides means for electrical attachment of the external motors. An electrical cable 30 connects connector 31 to connector 27. External amplifier 32 may be a commercially available amplifier provided the unit is sufficiently compact and lightweight.

Controller 35 is housed in a mechanical chassis 36. A microprocessor subsystem 39 is typically in electrical communication with all the other electronic subsystems and provides overall control to operate forcer 21 as required by the intended application. A communication subsystem 37 connected to an external port 38 provides a means of connecting controller 35 to an external computer or factory automation controller. An input/output interface 40 is used to condition electrical I/O signals from microprocessor 39 into appropriate formats as needed by sensor electronics 25 and amplifier 32. A set of amplifiers 42, provide drive current for forcer electromagnets 23. Amplifiers 42 are typically pulse-width modulated power amplifiers with output filters to reduce electromagnetic interference. I/O interface 40 and amplifiers 42 are electrically connected to a connector assembly 41. A power supply 43 connects to an AC inlet plug 45 and converts the supplied AC power to various DC voltages as required. Chassis 36 typically includes a system of fans 44 to provide forced air cooling of the entire controller 35.

Umbilical cable 34 is mechanically and electrically connected to controller 35 by connector assembly 41 and to forcer 21 by connector assembly 27. The number of conductor wires in umbilical cable 34 is determined by the specific requirements of forcer electromagnets 23, sensor electronics 25, external amplifier 32, and any additional I/O or other circuits required for a given application. Typical values are between 30 and 50 wires. The length of umbilical cable 34 is determined by specific application factors such as the overall machine size, the range of motion of forcer 21, the proximity of controller 35 to forcer 21 and the desire to manufacture a limited number of standard cable sizes. Typical values are 3 to 6 meters.

Figure 2:
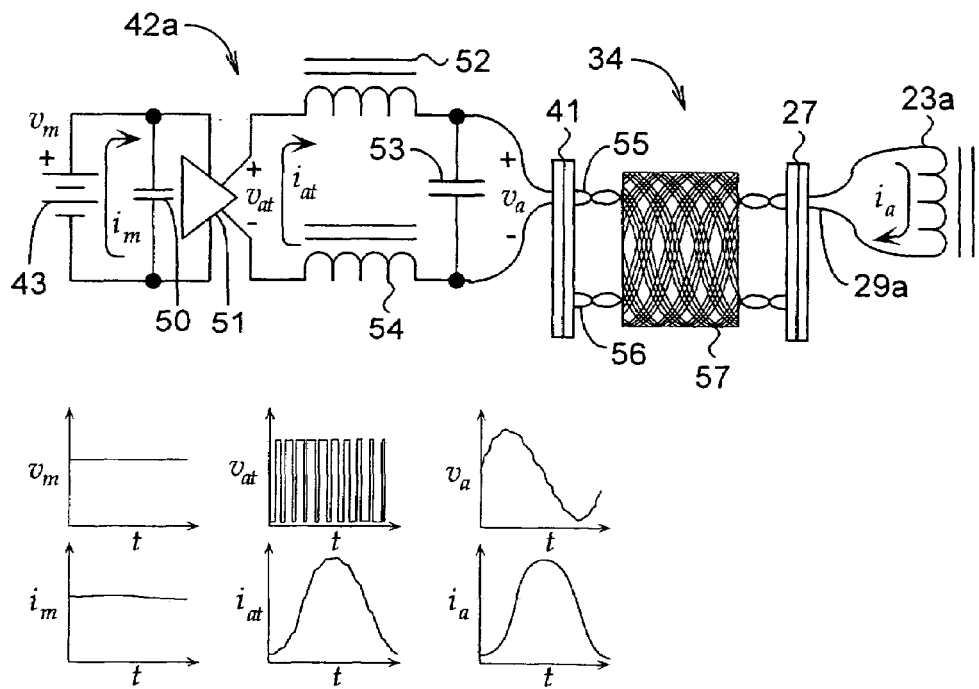

FIG. 2 is a partial schematic diagram of the amplifiers 42, umbilical cable 34, and forcer electromagnets 23 shown in FIG. 1. Power supply 43 sources current $i_m$ at potential $v_m$ to a bipolar amplifier 42a. Amplifier 42a sources a current $i_{at}$ to a low-pass filter consisting of a first inductor 52, a capacitor 53, and a second inductor 54. The filter output voltage is $v_a$ and the output current is $i_a$. The filter output connects to connector assembly 41. A twisted pair of wire conductors 55 in umbilical 34 conveys the electrical current to connector assembly 27 on forcer 21. Within forcer 21, conductors shown at 29a convey the current to an individual electromagnet 23a. While a single amplifier 42a, umbilical conductor pair 55, and electromagnet 23a are shown, a standard Sawyer forcer requires eight identical circuits. An additional conductor pair 56 is shown in umbilical 34 to illustrate additional wires. A braided nylon sheath shown at 57 is used to mechanically bundle and protect the wires within umbilical cable 34.

The nature of voltage and current waveforms for this circuit is shown in FIG. 2. Voltage $v_m$ is a constant DC potential typically in the range of 100 to 200 VDC. Current $i_m$ is a quasi DC signal, which varies with motor load conditions caused by acceleration. Signal $v_{at}$ is a pulse-width modulated (PWM) waveform with very fast dV/dt transitions with peak-to-peak amplitude of $2*v_m$. The PWM frequency is typically 50 KHz. The resulting synthesized current, $i_{at}$ has a typical amplitude of 1.5 A peak over a range of 0–1 KHz. It contains ripple at the PWM frequency. Voltage $v_a$, the output of the amplifier filter is a variable amplitude and frequency signal in the range of $2*v_m$ peak-to-peak and 0–1 KHz. Some ripple at the PWM switching frequency is also present. Current $i_a$ is a smoother version of $i_{at}$ with little PWM ripple component.

The total power $v_m*i_m$ provided by power supply 43, supplies the power sourced to the motor phases by amplifiers 42 as well as the substantial energy losses found in this system. Amplifiers 42 dissipate significant energy due to their high switching frequency. The output voltage filter components such as inductors 52 and 54 and capacitor 53 also dissipate energy due to resistive losses. The individual phase currents, such as $i_a$, circulate continuously from the respective amplifier, through the associated umbilical conductors and the motor phase electromagnet. These currents dissipate energy in the umbilical conductors, which are chosen to be as thin a gauge as possible in order to reduce the umbilical cable mass. The entire system may have a total power efficiency of less than 50% due to these loss mechanisms.

Each pair of motor phase lines in umbilical 34 operates with widely varying voltage and Current due to the high frequency commutation of current in the electromagnets 3. At a slew velocity of 1 meter/sec the phase currents of a typical Sawyer forcer alternate at 1 KHz with a voltage swing of 250V peak-to-peak and current swings of 3 A peak-to-peak. In addition, due to the incomplete voltage filtering of the amplifier outputs, a fraction of the PWM output, typically 5Vac at 50 KHz is coupled on each motor phase line in the umbilical. Much higher frequency noise signals from switching transients in controller 35 also couple to the conductors of umbilical cable 34. Each conductor acts as an antenna radiating electromagnetic noise to adjacent conductors within the umbilical and to external electrical equipment.

Twisted pairs of wire, such as 55, contained within umbilical 34 are very finely stranded copper conductors with a single thin layer of insulation. It has proven impractical to equip umbilical 34 with a braided metallic sheath that could also provide EMI shielding. A braided metallic sheath lacks the fatigue endurance required for millions of flexural cycles typical of umbilical cables. Metallic sheaths also add considerable mass and stiffness to the umbilical, both of which negatively impact system acceleration and velocity performance. In order to make umbilical 34 as lightweight and flexible as possible, electromagnets 23 are provided with low current, high voltage windings. High voltage poses a significant electrical shock hazard when used with a continuously flexing cable with single layer conductor insulation. The shock hazard extends to all components powered by these voltages.

A characteristic of existing systems is that the sum of currents in all the motor phases is much higher than $i_m$, the current sourced by power supply 43. A typical existing Sawyer forcer has phase resistance of 2.1 ohms, phase current of 1.06 A rms, and 8 phases. Total motor power dissipation at static rated force is 18.9 W. Current flow in the umbilical is 8.48 A rms both up and down. Sixteen conductors rated at 1.06 A in a common cable require 22-gauge wire to meet safety standards, yet commercially shipping systems use 29-gauge wire. At a bus voltage of 125Vdc, the required bus current is only 0.30 A dc at 50% system efficiency. Dynamically the motor can require up to 300 W, which results in a bus current of 4.8 Adc at 50% system efficiency. A single pair of 20-gauge wire can safely supply this current.

Additional significant drawbacks exist in current Sawyer forcer/controller systems such as shown in FIG. 1. When a long multi-conductor cable 34 couples two electronic systems such as controller 35 and forcer 21, the combined system is susceptible to external electromagnetic disturbances. Such disturbances may cause permanent damage to the system, or cause it to malfunction while operating. Specialized protection circuits for suppressing electromagnetic transients may be used to terminate both ends of all conductors in umbilical 34, but this significantly increases the cost and size of circuit boards used. Disturbance rejection on sensor feedback lines is particularly important for safe operation of the system.

Accordingly, sensor electronics 25 must convert sensor signals for safe transmission down umbilical 34, usually in a serial digital format, to I/O interface 40, which communicates the results to microprocessor 39. This conversion and transmission adds time delay to the feedback path decreasing control performance.

If additional amplifiers such as 32 are needed, they require additional wires in umbilical 34. Amplifier 32 is typically different from amplifiers 42 and requires additional software to interface with microprocessor 39. The entire system contains numerous printed circuit boards with multiple interconnections, which reduces the overall system reliability. Umbilical failure is one of the most common reliability issues in existing systems. Failure rates increase with the number of wires in the umbilical.

BACKGROUND OF INVENTION—OBJECTS AND ADVANTAGES

Accordingly, several objects and advantages of the present invention are:

(a) to provide a Sawyer forcer/controller system which reduces electromagnetic interference produced by the umbilical cable by eliminating all rapidly varying voltage and current waveforms from conductors within the cable;

(b) to provide a Sawyer forcer/controller system which reduces shock hazard by restricting all voltages to the 48V dc or less;

(c) to provide a Sawyer forcer/controller system with improved power efficiency by having the umbilical convey bus current rather than phase current;

(d) to improve the system power efficiency by reducing the PWM amplifier switching frequency and eliminating the output voltage filter and its associated power loss;

(e) to provide a Sawyer forcer/controller system with an umbilical cable having a minimum number of conductors to increase reliability and having minimum mass to increase motion performance.

(f) to provide a Sawyer forcer/controller system with integrated control electronics implemented on substantially a single printed circuit board thus improving system reliability by eliminating multiple printed circuit boards and interconnect systems.

(g) to provide a Sawyer forcer/controller system with integrated, modular control electronics for simple interfacing of additional external motor axes which simplifies the building of custom multi-axis machines;

(h) to provide a Sawyer forcer/controller system and associated control electronics which is less susceptible to electromagnetic interference by enclosing all the control electronics within a single metallic enclosure;

(i) to provide a Sawyer forcer/controller system with closer coupling between platen position sensors and the motion control electronics thus decreasing feedback latency and noise while allowing improved control performance;

(j) to provide a Sawyer forcer/controller system with integrated thermal control components to control heating in the motor coils and the control electronics;

(k) to provide a modular control system that is easily configured to support both 2/4-phase and 3-phase or higher phase Sawyer forcers using a common set of components.

Additional objects and advantages of the invention will become apparent from the following description and drawings.

SUMMARY

The above objects are accomplished by integrating most of the elements of a traditional Sawyer forcer controller unit into a modified forcer case. Conventional Sawyer forcer systems place control electronics and motor amplifiers in a remotely mounted chassis connected to the forcer by a long umbilical cable. The umbilical cable may contain 30 to 50 conductors used for motor phase lines, feedback sensors signal lines, logic level voltage supply lines, input/output signal lines, and lines for controlling additional motor axes added externally to the forcer. By incorporating the control electronics and amplifiers within the forcer, the number of conductors required in the umbilical is reduced to the range of 4 to 10 lines. A metallic forcer case is designed to provide an interior cavity of suitable size to fully house all of the control electronics. A metallic top plate provides a cover to the forcer case. Selected sidewalls of the forcer case are provided with openings to which cooling fans are attached. The cooling fans direct airflow across the enclosed electronics and the interior surface of the motor coils to remove heat generated by these components.

The integrated control electronics consist of one or more printed circuit boards. The circuit boards contain power supply conditioning and supervisor circuits, an external host communication interface, input/output circuits, one or more microprocessors to implement control programs for motion and I/O control, sensor interface circuits for platen feedback sensors and external axis feedback sensors, amplifiers for the Sawyer forcer coils, and optional additional amplifiers for external motors.

Integration of amplifiers within the forcer case largely eliminates radiated electromagnetic emissions observed in conventional Sawyer forcer/controller systems. Umbilical power dissipation is greatly reduced, since the umbilical sources only the system bus current, not the total forcer phase currents. A single pair of power conductors is required in the umbilical rather than the eight pairs required for phase leads in existing systems. This enables low voltage high current phase windings compatible with low voltage safety standards for reducing hazardous shock danger. By enclosing the system electronics within a single metallic enclosure formed by the forcer and cover plate, the Sawyer forcer/controller system is much less susceptible to external electromagnetic interference. Reducing the number of lines in the umbilical cable also improves electromagnetic immunity and simplifies protection circuits.

In a preferred embodiment of the invention, the power amplifiers that drive current through the Sawyer forcer coils consist of four removable units, which mount on the control electronics printed circuit board using board-to-board stacking connectors. A variety of amplifier designs support a variety of Sawyer forcer designs such as 2/4-phase or 3-phase systems. Additional amplifier sockets are provided on the control PCB to provide control of external motors typically added in building robotic or assembly systems. A variety of amplifier designs for these sockets support most of the commonly used rotary and linear motor axis. These additional amplifiers have common software interface requirements as the Sawyer forcer amplifiers allowing seamless integration of external motors.

A variety of position sensor systems are available for sensing the position of the forcer relative to the platen. Conventionally these systems integrate the sensing elements into the forcer frame along with a circuit board containing signal conditioning and processing electronics. The derived position information is then communicated to the remote control electronics using signal lines in the umbilical cable. The integrated control electronics PCB of the present invention directly incorporates the sensor processing electronics eliminating much of the complexity and time delays of conventional systems that incorporate feedback sensors.

DRAWINGS—FIGURES

Figure 3:
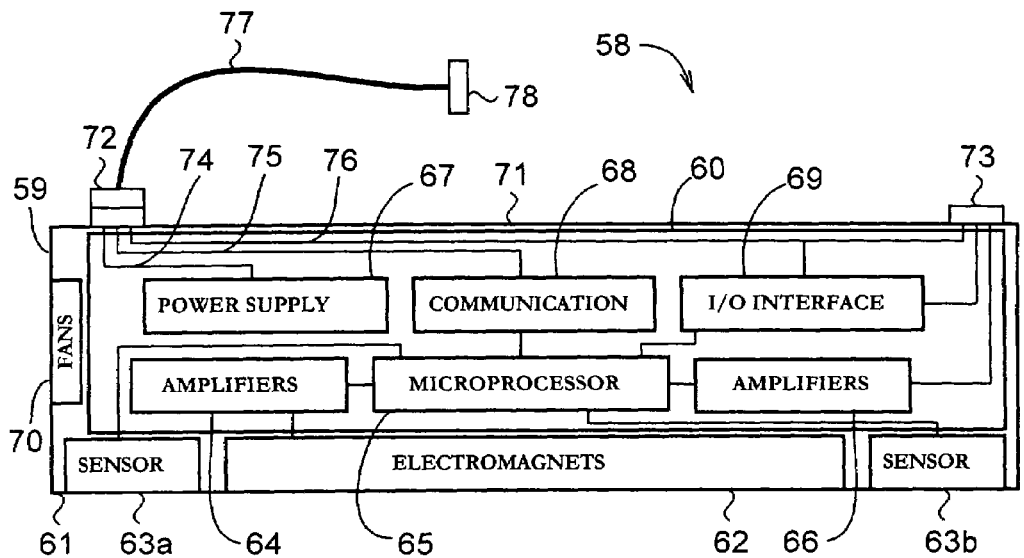
Figure 4:
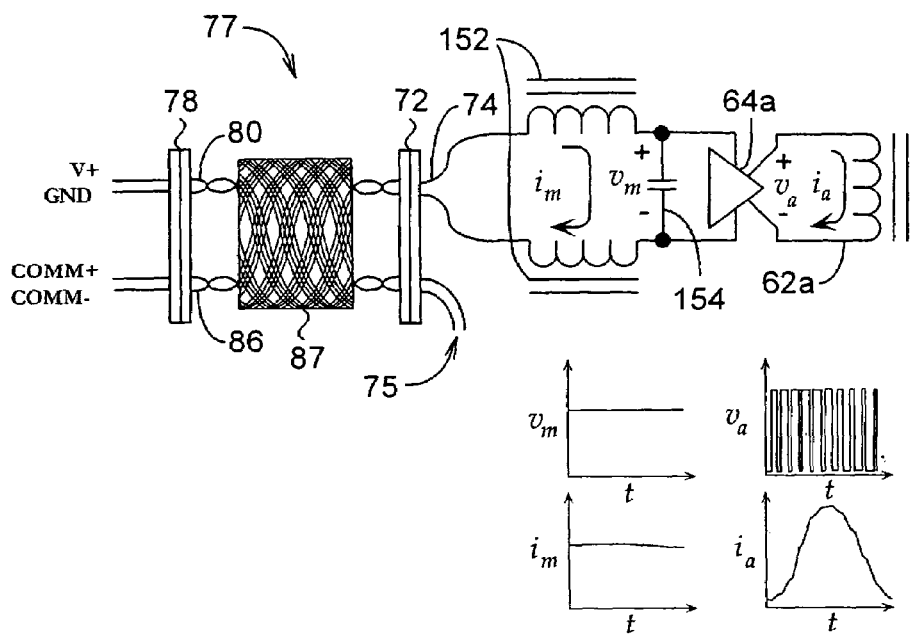
Figure 5A:
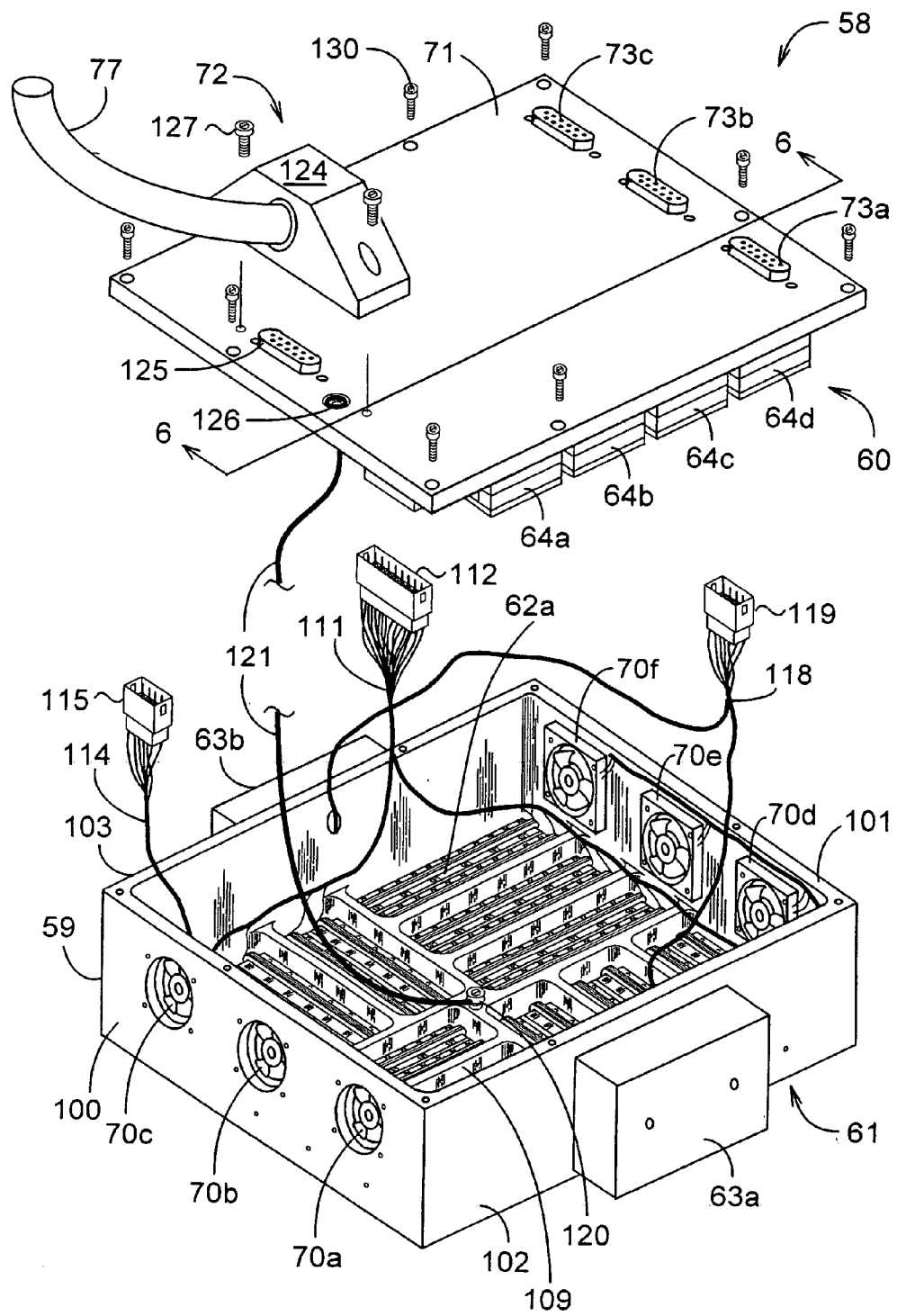
Figure 5B:
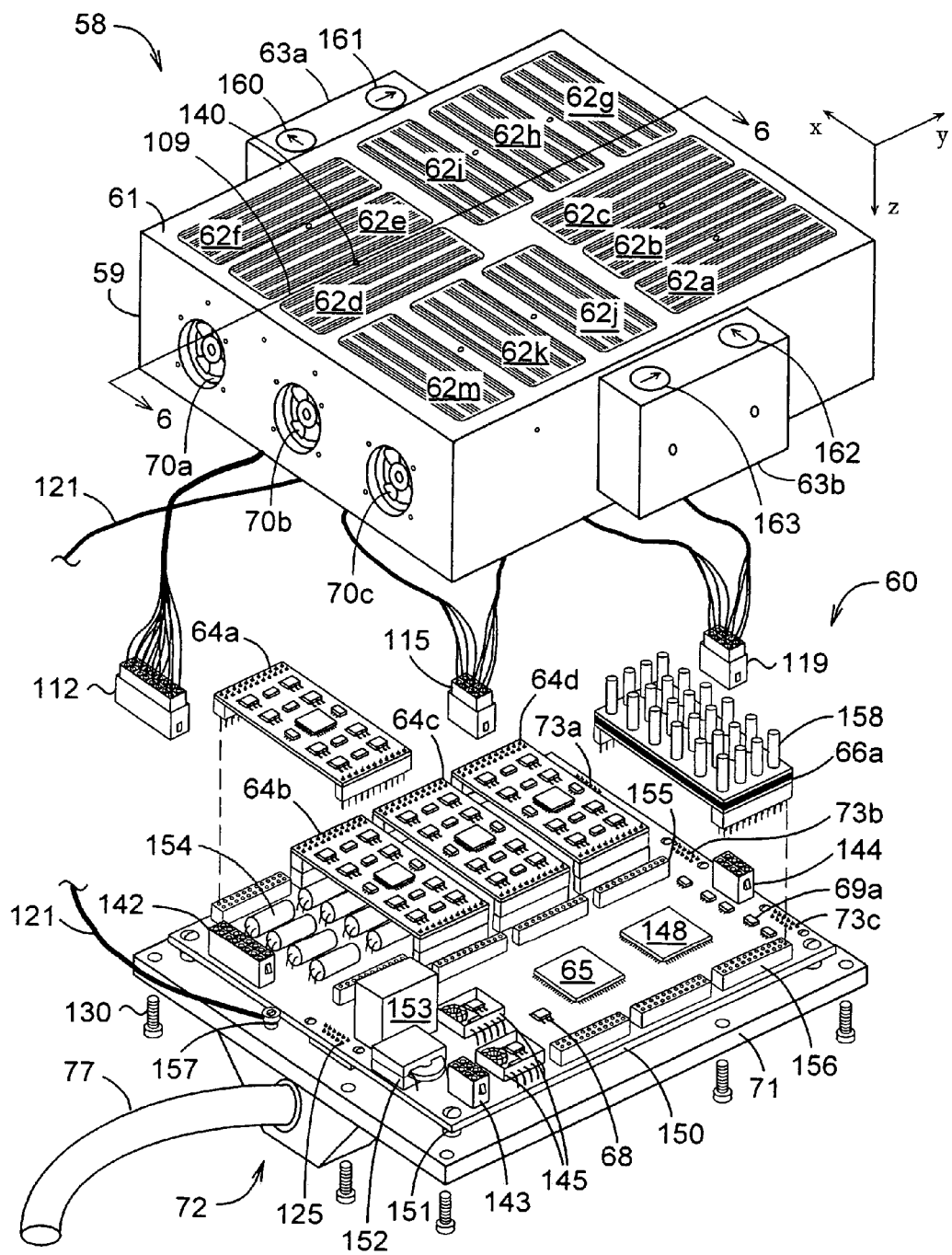

SHEET 1:
FIG. 1: Plan view of prior art forcer/controller systems.
FIG. 2: Partial schematic of prior art forcer/controller systems showing signal waveforms.
SHEET 2:
FIG. 3: Plan view of forcer with integrated controller.
FIG. 4: Partial schematic of forcer with integrated controller showing signal waveforms.
SHEET 3:
FIG. 5A: Top, partially exploded view of integrated forcer with discrete amplifiers.
SHEET 4:

FIG. 5B: Bottom, partially exploded view of integrated forcer with discrete amplifiers.

Figure 6:
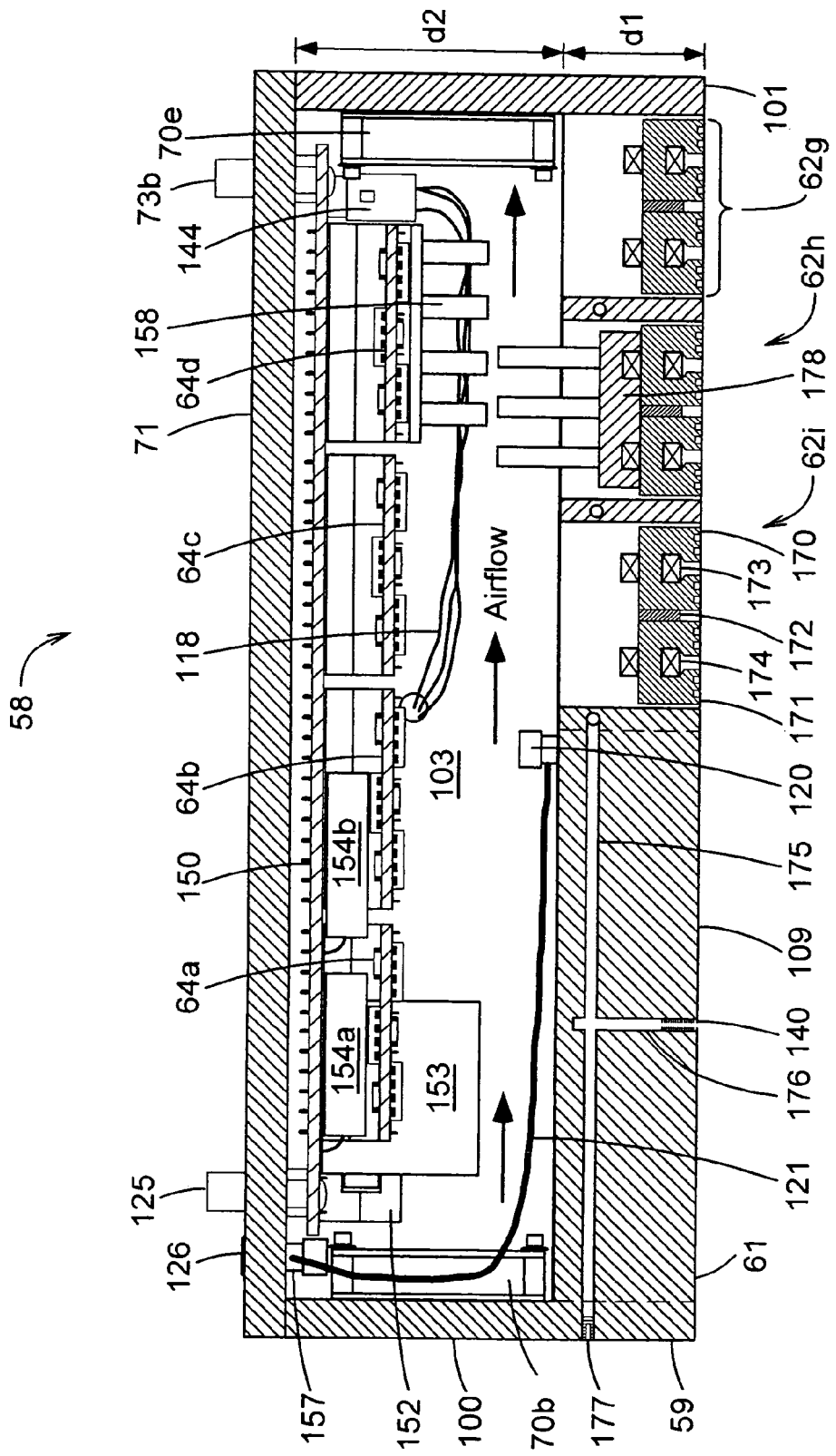

SHEET 5:

FIG. 6: Sectional view of integrated forcer with discrete amplifiers.

Figure 7:
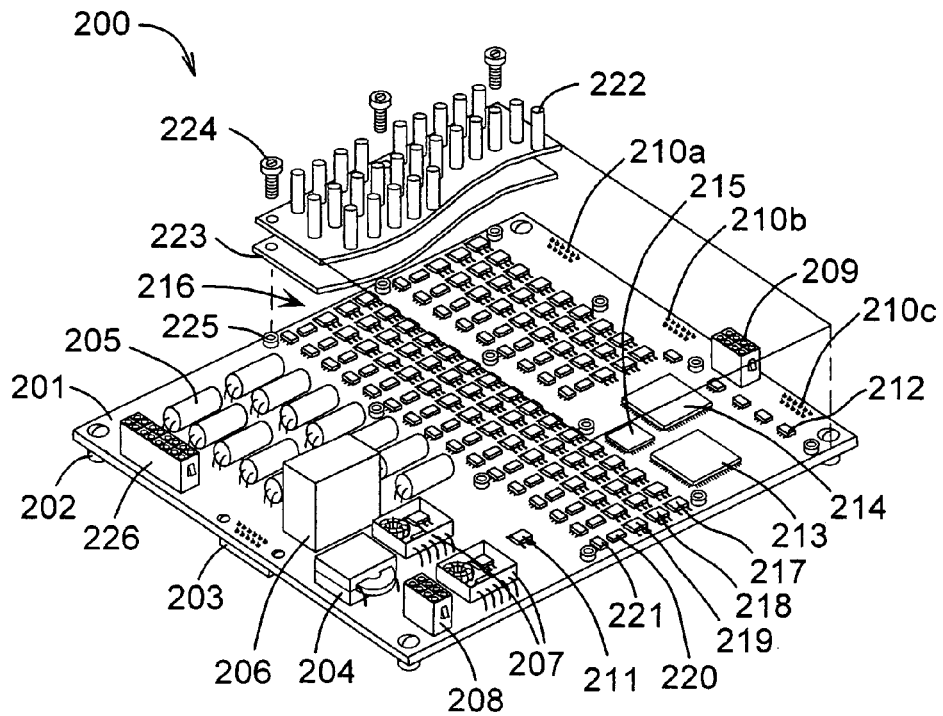

SHEET 6:

FIG. 7: Perspective, partially exploded view of monolithic controller/amplifier.

Figure 8:
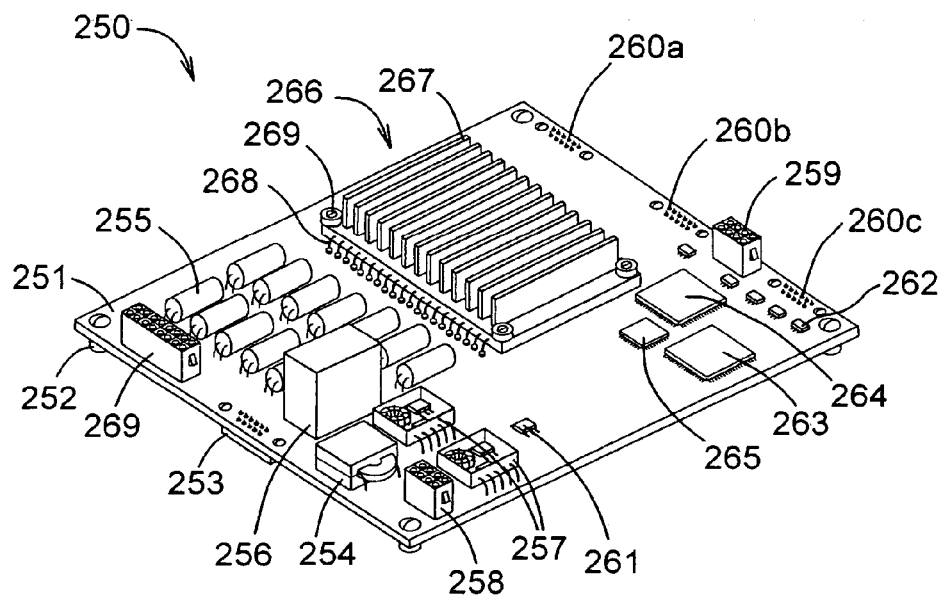

FIG. 8: Perspective view of hybrid controller/amplifier.

Figure 9A:
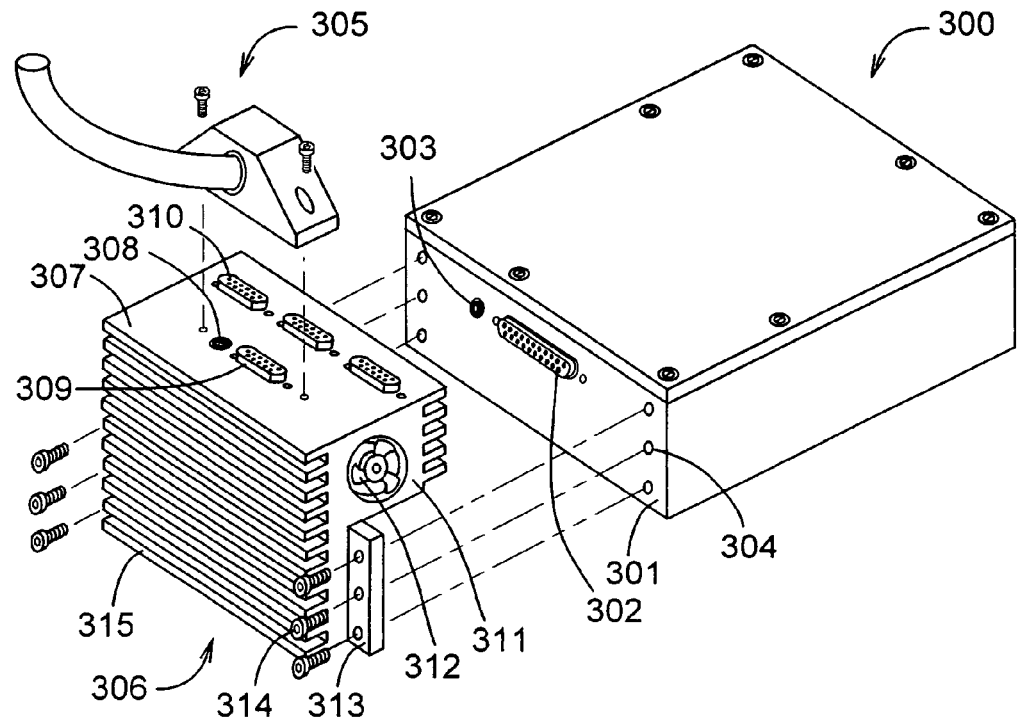

SHEET 7:

FIG. 9A: Top, partially exploded view of externally mounted controller/forcer system.

Figure 9B:
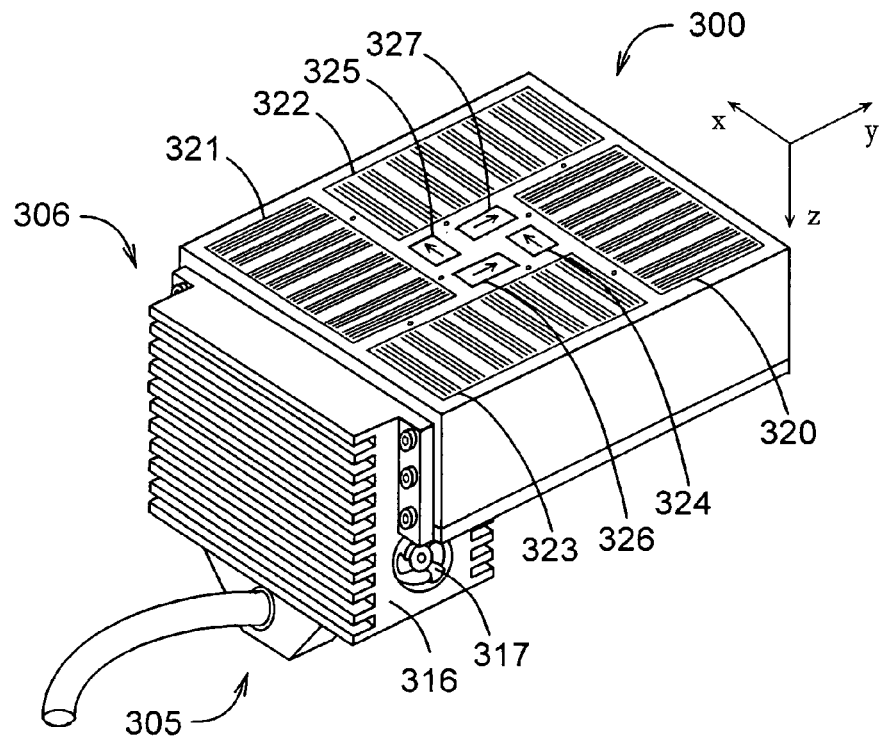

FIG. 9B: Bottom perspective view of externally mounted controller/forcer system.

DETAILED DESCRIPTION OF PREFERRED EMBODIMENT—FIGS. 3, 5A, 5B, 6

Referring to FIG. 3, a forcer 58 is shown with an attached connector assembly 72 and an umbilical cable 77. Umbilical cable 77 is terminated at one end by connector assembly 72 and at the other end by a connector or terminal strip 78. Forcer 58 includes a case 59 fitted with a cover plate 71. Within forcer 58 adjacent to a surface 61 of case 59 are a set of electromagnets 62 and optional feedback sensors 63a and 63b. Within forcer 58 is a controller 60 containing all the elements necessary to control the forcer as either an open-loop or a closed-loop motion system.

Umbilical cable 77 supplies forcer 58 with DC power of typically 48 volts through a set of conductors 74. A set of conductors 75, in electrical connection with umbilical cable 77, provides a communication link between controller 60 and any external computer or automation systems. A set of conductors 76, in electrical connection with umbilical 77, provides a number of discrete input/output (I/O) circuits for safety, status, and general purpose I/O to be used by any external computer or automation systems. The number of conductors 76, and associated wires required in umbilical cable 77, may vary by application or for marketing reasons. Umbilical cable 77 also provides compressed air to forcer 58 through connector assembly 72 better shown in FIG. 5A and FIG. 5B.

A power supply 67 conditions the 48 volt DC power received from conductors 74, and supplies the correct voltages to the other electronic elements of controller 60. A communication circuit 68, connected to conductors 75, provides a communication interface. An I/O circuit 69 contains electrical conditioning circuits for isolation and voltage level conversion between external I/O circuits and internal electronics of controller 60. A set of amplifiers 64 regulates the current in electromagnets 62 to control the motion of forcer 58. An additional set of amplifiers 66 provides control of optional external motors through a group of connectors shown at 73. A microprocessor circuit 65 interfaces to communication circuit 68, I/O interface 69, forcer amplifiers 64, external motor amplifiers 66, and feedback sensors 63a and 63b. Microprocessor circuit 65 contains control programs for accepting motion and I/O commands from an external controller through communication interface 68, and executing those commands to produce controlled motion of forcer 58 by commanding amplifiers 64 to regulate a sequence of current levels in electromagnets 62. Similarly, microprocessor circuit 65 accepts and executes commands to control external motors using amplifiers 66. If forcer 58 lacks optional feedback sensors 63a and 63b, microprocessor 65 controls the forcer in an open-loop manner. If forcer 58 is equipped with feedback sensors 63a and 63b, microprocessor 65 controls the forcer in a closed-loop servo manner using the sensor supplied feedback data. Any external motor axes connected to amplifiers 66 through connectors 73 may supply feedback through I/O interface 69 to microprocessor 65, allowing either open-loop or closed-loop control of these external axes.

FIG. 4 is a partial schematic of the invention of FIG. 3 showing selected wiring components of umbilical 77. Umbilical connector 78 provides a means of coupling externally supplied DC power shown as V+ and GND, typically 48Vdc. Connector 78 also provides a connection for communication to an external host or control system via two signal lines COMM+ and COMM−. Power lines V+ and GND are coupled to a twisted pair of conductors 80 while COMM+ and COMM− are coupled to a twisted pair of conductors 86 in umbilical cable 77. A braided nylon sheath 87 forms an outer protective coat for umbilical 77. At the opposite end of umbilical 77, power conductors 80 are coupled to conductors 74 within forcer 58. Power on conductors 74 couple to an EMI filter 152 and a capacitor bank 154. Communication conductors 86 couple to conductors 75 leading to a communication circuit shown in FIG. 3 on controller 60.

A single power amplifier shown as 64a is electrically connected to capacitor bank 154. The amplifier output connects to an electromagnet 62a. The number of amplifiers and matching electromagnets may vary depending on the number of phases and number of linear motor segments in forcer 58.

FIG. 5A is a top, partially exploded view of one implementation of the present invention. Cover plate 71 is shown removed from case 59. Umbilical cable 77 terminates in connector assembly 72 at forcer 58. Umbilical cable 77 contains conductor wires, not shown, for power and ground, communications, and I/O, and an air supply hose, not shown. The length of umbilical cable 77 is determined by application and may range from less than one meter to greater than 5 meters. The other end, not shown, of umbilical cable 77 is typically equipped with a connector assembly or terminal strip to provide means of coupling externally supplied power, communications, I/O, and air to systems on forcer 58. Connector assembly 72 consists of a mechanical housing 124 typically formed from anodized aluminum. An electrical connector, not shown, in housing 124 terminates the conductor wires of umbilical cable 77 and mates with a matching connector 125 mounted in cover plate 71. A recessed rubber O-ring 126 in cover plate 71 faces an air port in housing 124, not shown, which terminates the air tube contained in umbilical cable 77. Housing 124 provides mechanical strain relief for umbilical cable 77 and mounts to cover plate 71 using a pair of machine screws, one of which is shown at 127.

A set of three electrical connectors 73a, 73b and 73c are mounted in cover plate 71 to provide means for electrically interfacing external motors and I/O typically added to forcer 58 as required by application. Mounted to the undersurface of cover plate 71 is controller 60 of FIG. 3, only partially visible here. Connectors 73a, 73b, 73c and 125 are electrically connected to controller 60, better shown in FIG. 5B. Partially visible are a set of four amplifiers 64a, 64b, 64c, and 64d of controller 60. Cover plate 71 mounts to case 59 via screws, one of which is shown at 130.

Case 59 is a thin walled structure, typically anodized aluminum, consisting of four sidewalls, 100, 101, 102 and 103, and a lower face 61. On sidewall 100 is mounted a set of three small fans 70a, 70b, and 70c which induce airflow from outside case 59 to flow inside case 59. On sidewall 101 is mounted a set of three small fans 70d, 70e, and 70f which induce airflow from inside case 59 to flow outside case 59. Fans 70a–70f thus work cooperatively to induce external airflow through case 59 for cooling purposes. The electrical wires for fans 70a–70f are formed into a cable 114, which terminates in an electrical connector 115.

Optional feedback sensor 63a is mounted on sidewall 102 of case 59 and optional feedback sensor 63b is mounted on sidewall 103 of case 59. The electrical wires for sensors 63a and 63b are formed into a cable 118, which terminates in an electrical connector 119.

The interior portion of case 59 near surface 61 consists of intersecting ribs, one of which is shown at 109, formed by machining a pattern of pockets in face 61. Electromagnets, one of which is shown at 62a, are affixed within the pockets. The electromagnets' leads are formed into a cable 111, which terminates in an electrical connector 112. An air fitting 120 mounts to the rib structure formed behind surface 61, and connects via a flexible air hose 121 to O-ring port 126 in cover plate 71. A series of intersecting holes, better shown in FIG. 6, drilled in ribs such as 109 connect air fitting 120 with a series of air jets mounted in surface 61, better shown in FIG. 5B and FIG. 6.

FIG. 5B is a bottom, partially exploded view of the invention shown in FIG. 5A. A set of 12 electromagnets, 62a, 62b, 62c, 62d, 62e, 62f, 62g, 62h, 62i, 62j, 62k, and 62m are mounted in face 61 of case 59 and grouped to form four independent linear motor segments. Electromagnets 62a, 62b, and 62c form a first linear motor segment, which functions in the x-direction. Electromagnets 62d, 62e, and 62f form a second linear motor segment, which functions in the x-direction. Electromagnets 62g, 62h, and 62i form a third linear motor segment, which functions in the y-direction. Electromagnets 62j, 62k, and 62m form a fourth linear motor segment, which functions in the y-direction. Electromagnets are separated from each other by ribs, one of which is shown at 109, formed by machining pockets in face 61 of case 59. Wires from all electromagnets terminate in connector 112.

A set of air jets, one of which is shown at 140, are screwed into recessed threaded holes in ribs such as 109. Intersecting holes, shown in FIG. 6, drilled in ribs such as 109 connect air jets such as 140 to air fitting 120 shown in FIG. 5A. Flexible air hose 121 connects fitting 120 to an air fitting 157 mounted on cover plate 71. Air fitting 157 is ported to recessed O-ring 126 seated in cover plate 71 to obtain compressed air from umbilical 77 better shown in FIG. 5A.

Optional feedback sensor 63a contains a pair of sensing elements, 160 and 161. Sensing element 160 senses motion in a first direction x, while sensing element 161 senses motion in a second direction y. Similarly, feedback sensor 63b contains a pair of sensing elements, 162 and 163. Sensing element 162 senses motion in a first direction x, while sensing element 163 senses motion in a second direction y. Wires from sensors 63a and 63b terminate in electrical connector 119 as previously described.

Fans 70a, 70b, and 70c are visible in case 59. Wires from all six fans, better shown in FIG. 5A, terminate in electrical connector 115 as previously described.

Controller 60 consists of a printed circuit board (PCB) 150 and all of the electronic circuits mounted on it. PCB 150 attaches to cover plate 71 using standoffs, one of which is shown at 151. PCB 150 provides mechanical mounting and electrical interconnection for the electronic elements of control system 60 contained within forcer 58 shown in FIG. 3.

Umbilical cable 77 terminates in housing assembly 72, which is in electrical contact with connector 125 as previously shown in FIG. 5A. Connector 125 is in electrical and mechanical contact with PCB 150. Connector 125 may be either of the through hole contact type as shown in FIG. 5B, or it may use surface mount contacts for connection to PCB 150. Connector 125 couples power and signal lines of umbilical 77 to PCB 150. Conductive lines 74, shown in FIG. 3, connect power and ground lines from umbilical 77 to power supply circuits on PCB 150. Conductive lines 75, shown in FIG. 3, connect communication signal lines from umbilical 77 to a communication interface integrated circuit 68 on PCB 150. Conductive lines 76, shown in FIG. 3, connect safety, status, and general purpose I/O signal lines from umbilical 77 to various circuit elements on PCB 150 as well as to connectors 73a, 73b, and 73c.

Power supply 67 of FIG. 3 consists of electronic circuits for conditioning and controlling power on PCB 150. A remote power supply provides typically 48V DC power through umbilical 77. An input EMI filter 152, conditions the input 48V DC power to reduce conducted noise on the power supply lines of umbilical 77. One or more DC—DC converter circuits shown at 145 convert the 48V DC to logic level voltages as needed by the electronic circuit elements of PCB 150. Logic voltages typically include 5V DC, 3.3V DC, and 2.5V DC. Voltage converter circuits 145 may use commercially available units as shown, or may be custom designs implemented directly on PCB 150. A bank of capacitors, shown at 154, is electrically connected to 48V DC through a relay 153 and EMI filter 152. The capacitor bank in conjunction with EMI filter 152 provides suppression of unwanted current ripple in the power supply lines of umbilical 77. A connector header 143 mounted on PCB 150 is in electrical connection with converter circuits 145. Electrical cable 114 from fans 70a–70f, better shown in FIG. 5A, terminates in connector 115 which plugs into header 143 to provide power for the fans.

Microprocessor 65 and a digital logic integrated circuit 148 comprise the digital control circuit of PCB 150. Microprocessor 65 may be any general-purpose microprocessor (MPU), microcontroller (MCU), or digital signal processor (DSP) provided with suitable performance for controlling forcer 58. The preferred processor is a dual core device such as the Analog Devices, Inc. ADSP-BF561. Digital logic integrated circuit 148 is typically a Field Programmable Gate Array (FPGA) but may also be a Complex Programmable Logic Circuit (CPLD) or Application Specific Integrated Circuit (ASIC). CPLD and FPGA devices are preferred for circuit 148 when manufacturing volumes are low, while an ASIC is preferred when volumes are high. Microprocessor 65 is in electrical communication with logic circuit 148. As previously described, motion sensors 63a and 63b are electrically connected through cable 118 to connector 119. Mounted on PCB 150 is a connector header 144 in electrical communication with digital logic circuit 148 and microprocessor 65. Digital logic circuit 148 contains control circuitry as needed for the particular type of motion sensor 63a and 63b used. Control programs on microprocessor 65 are dedicated to controlling sensors 63a and 63b to compute motion values of forcer 58.

One or more integrated circuits 68 provide a communication interface between microprocessor 65 and umbilical cable 77. Circuit 68 is electrically connected to umbilical 77 and to microprocessor 65. Circuit 68 depends on the particular communications interface chosen, and may vary by customer needs or for marketing reasons. Typical communications interfaces commonly used in industrial control systems include RS-232C, RS-422/428, Universal Serial Bus (USB), Firewire/IEEE 1394, Ethernet, and CANbus. Wireless interfaces may also be used, but are not yet in widespread use in industrial settings. Wireless standards include Bluetooth, 802.11 g, and Ultrawideband systems for Radio Frequency (RF) and IRDA using optical interconnect over free air. If circuit 68 implements a wireless standard, it is not in electrical communication with umbilical 77. RF interfaces may require a small antenna, not shown, while IRDA requires an LED link, not shown. Specialized interface circuits 68 are required for each communication type and are readily available from multiple chip manufactures. It is preferred that a suitable area of circuit board 150 be reserved for implementing these circuits so that the most common designs can be implemented with only minor modification during manufacturing.

Connectors 73*a*, 73*b*, and 73*c*, better shown in FIG. 5A, are electrically and mechanically connected to PCB 150. Although through hole connectors are shown, surface mount connectors may be used instead. Connectors 73*a*, 73*b*, and 73*c* are provided to allow users to connect externally mounted motors, encoders and I/O to PCB 150 and the control elements contained on it. A set of integrated circuits, one of which is shown at 69*a*, provide interface conversion and isolation between connectors 73*a*, 73*b*, and 73*c*, and the electronic elements of PCB 150. These integrated circuits are typically opto-isolators and are available from many manufactures.

Disposed near the middle of PCB 150 are two rows of single row connector sockets, one of which is shown at 155. Disposed along two outer edges of PCB 150 are rows of double row connector sockets, one of which is shown at 156. Single row and double row sockets such as 155 and 156 are paired and form an interconnection means for miniature modular power amplifiers. A total of 7 socket pairs are provided on PCB 150. A set of four similar amplifiers 64*a*, 64*b*, 64*c*, and 64*d*, are required for controlling electromagnets 62 of forcer 58. Amplifier 64*a* is shown disposed above its mounting sockets, while amplifiers 64*b*, 64*c*, and 64*d* are shown in the mounted position. Amplifiers 64*a*, 64*b*, 64*c*, and 64*d* are connected via traces on circuit board 150 to a connector header 142 which provides a connection with connector 112 and cable 114 leading to electromagnets 62 of forcer 58.

Three additional amplifiers may be added to the remaining three socket pairs to provide control of external motors, as application requires. A single such amplifier is shown at 66*a*. Single row sockets such as 155, are in electrical communication with microprocessor 65 and logic circuit 148 for control purposes. Double row sockets such as 156, are in electrical connection with the respective motors controlled by the amplifier. Optional amplifier sockets such as pair 155 and 156, connect to connectors 73*a*, 73*b*, and 73*c*.

All amplifiers 64 and 66 are commercially available from motionCODEC, Inc. They are available as either 2T-Bridge, 3T-bridge or 4T-bridge versions to support brush type DC motors, 3-phase brushless or AC servo motors, or stepper motors. They operate using Pulse Width Modulation (PWM) for high efficiency. They may be equipped with an optional finned heatsink 158 to improve heat dissipation. The power ratings of these amplifiers are compatible with the size of motors typically used with forcer 58. Other manufactures offer similar small amplifiers that could be used if circuit board 150 is provided with the required connector types for these different devices. There are no industry standards for small amplifier mechanical footprints or electrical pinouts, thus circuit board 150 must be designed specifically for the amplifiers used.

FIG. 6 is a sectional view of the invention shown in FIGS. 5A and 5B. Forcer 58 is shown with cover plate 71 attached to case 59. Sidewalls 100 and 101 and rib 109 of case 59 are shown in section. Visible in sectioned rib 109 is a pair of intersecting holes 175 and 176 formed by drilling. Additional intersecting holes, not visible, in additional ribs of case 59 lead to air fitting 120. Air jet 140 is screwed into the lower portion of hole 176 to regulate the airflow emerging from face 61 of forcer 58. Holes such as 175 in rib 109 are drilled from the exterior faces of case 59 such as 100 and sealed using setscrews, one of which is shown at 177. Air fitting 120 connects to flexible air hose 121, which connects to air fitting 157 mounted to cover plate 71. Air fitting 157 is ported to recessed O-ring 126 seated in cover plate 71 to obtain compressed air from umbilical 77 shown in FIG. 5A.

Electromagnets 62*g*, 62*h*, and 62*i* are shown in section. The component parts of electromagnet assembly 62*i* are given in detail. A set of two U-shaped toothed iron cores 170 and 171 are bonded to a permanent magnet 172. A winding of magnet wire 173 is wound on core 170 and a winding of magnet wire 174 is wound on core 171. The design principles for such electromagnetic assemblies are well known in prior art and many possible variations exist. The present invention is not limited to any specific design of electromagnets. The entire electromagnet assembly is typically bonded to case 59 using a high strength and temperature stable epoxy (not shown).

Circuit board 150 is shown below cover plate 71. Connector 125 mounted to circuit board 150 protrudes through cover plate 71 to provide electrical connection with umbilical 77 as shown in FIG. 5A. Connector 73*b* mounted to circuit board 150 protrudes through cover plate 71 to provide electrical connection for external motors or I/O. Amplifiers 64*a*, 64*b*, 64*c*, and 64*d* are visible in section, attached to circuit board 150. A pair of capacitors 154*a* and 154*b*, of capacitor bank 154 shown in FIG. 5B, are visible sandwiched between circuit board 150 and amplifiers 64*a* and 64*b* respectively. Relay 153 and filter inductor 152 are partially visible behind amplifier 64*a*. Connector 144 on circuit board 150 interfaces to sensor signal cable 118.

Fan 70*b* is mounted to sidewall 100 of case 59 and fan 70*e* is mounted to sidewall 101 of case 59 causing air to flow through the interior cavity of forcer 58 as shown. Finned heatsinks such as 158, better shown in FIG. 5B, protrude into the airflow to provide amplifier cooling. A similar finned heatsink 178 is shown in section, attached to electromagnet assembly 62*h*. Heatsink 178 is shaped to conform to the profile of electromagnet assembly 62*h* and is bonded to it with a thermally conductive adhesive. Heatsink 178 conveys heat from electromagnet assembly 62*h* to the airflow induced by fans 70*b* and 70*e*. Heatsinks such are 158 are typically provide for all amplifiers and heatsinks such as 178 are typically provided for all electromagnet assemblies although not shown in the other figures for clarity.

Operation of Preferred Embodiment—FIGS. 3, 4, 5A, 5B, 6

The functional operation of the present invention is similar to existing systems in most respects. However, the present invention provides much improved performance over existing systems due to aspects of its design as will be described in this section.

As shown in FIG. 4, and previously described, a minimum of 4 conductors, consisting of two power and two communications lines, are supplied from an external source with power and communication links. Power is typically supplied from an AC to DC power supply, which converts standard 120 or 240VAC power to 48Vdc. The communication link provides means for any external automation systems to communicate with forcer 58. A typical two-wire link is CANbus, which uses a differential signal on a twisted pair line. Umbilical 77 connects power and communication to forcer 58. In typical systems, power may consist of redundant pairs of conductors in umiblical 77, and additional I/O lines 76 may be added for safety and control purposes leading to an umbilical with about 10 conductors.

Power supplied to forcer 58 is filtered and controlled by EMI filter inductor 152 and a bank of electrolytic capacitors 154 of FIG. 5B. Relay 153 is provided to controllable disable 48Vdc to all amplifiers for safety. The combination of inductor 152 and capacitors 154 forms a local energy storage system within forcer 58 closely coupled to amplifiers 64 and 66. The action of this circuit results in an quasi-DC current shown as $i_m$ in FIG. 4 which flows from external V+ power source, up power conductors 80 to amplifiers 64 within forcer 58 and back down to GND. As a result, power conductors 80 in umbilical 77 operate at a constant voltage potential of 48Vdc and a quasi-DC current flow. The quasi-DC current flow varies according to motor operational conditions and reflects the actual motor power use, which fluctuates as the motor accelerates and decelerates or slew's at constant velocity. Typical bandwidth for such current fluctuation is a few tens of hertz. In addition, there exists an additional small fixed DC component to current $i_m$ sufficient to source the power requirements of the electronic components within forcer 58.

Microprocessor 65 contains programs for operating forcer 58 as a high performance motion system according to commands received by communication interface 68 from an external host. Commands received from an external host are typically high-level motion commands such as position points, velocity and acceleration values. Digital and analog I/O commands are also supported. Programs executing on microprocessor 65 implement a robust command interface to any external host and include highly reliable error handling. Commanded motion values such as position, velocity and acceleration are operated on by a trajectory generation program in microprocessor 65 which outputs finely interpolated position goal points at approximately 16 KHz for each axis of motion controlled.

If forcer 58 is equipped with optional feedback sensors 63, then additional programs in microprocessor 65 operate in conjunction with digital logic circuit 148 to compute the position in x, y and a small rotation of about +/−3 degrees about z. If optional external motors are connected via connectors 73a, 73b, and 73c microprocessor 65 and digital logic circuit 148 compute feedback positions for these axes as well. Dynamic control programs in microprocessor 65 combine the interpolated position goal points output by the trajectory generation program with axis feedback positions to compute dynamic position errors for each controlled axis. Dynamic position errors are then operated on by digital position control programs within microprocessor 65 to compute command currents for each motor phase amplifier.

The exact nature of the dynamic control programs depends on the type of motor being controlled. Sawyer forcers may be either 2/4-phase or 3-phase designs. External motors may be brush type DC motors (single phase), stepper motor (2/4-phase) or brushless/ac servo motors (3 phase).

The plug-in amplifiers 64, for controlling the Sawyer forcer, and 66, for external motor axes, are chosen to match the phase style of the motors. The Sawyer forcer shown in FIGS. 5A, 5B, and 6 uses 3-phase linear motor segments so amplifiers 64a, 64b, 64c, and 64d are 3-phase amplifiers also known as 3 T-bridge amplifiers. A 2/4-phase Sawyer forcer requires 2/4-phase amplifiers also known as 4 T-bridge amplifiers. Microprocessor 65 outputs phase current commands at typically 16 KHz or higher to amplifiers 64 and 66 using a 16-bit digital synchronous serial interface as required by the motionCODEC amplifiers. Amplifiers 64 and 66 contain internal digital control circuits and programs, which function to regulate the current in connected motor windings.

Accordingly, important advantages of the operation of the present invention over existing systems may be observed. Umbilical cable 77 has been greatly simplified by replacing 12 or 16 Sawyer forcer phase lines operated with rapidly varying voltage and current waveforms with two DC power lines operated at constant DC voltage and slowly varying or quasi-DC current. If additional external motors are required by applications, substantial additional motor phase lines are also eliminated from umbilical cable 77, as the present invention does not require any umbilical changes when supporting up to three additional motors. The present invention thus greatly reduces the mass, complexity, power dissipation, electromagnetic interference and cost associated with umbilical cables of existing systems. The resulting system has higher dynamic motion performance due to decreased umbilical mass and higher reliability due to lower EMI and thermal issues.

Since only the DC bus current flows in conductors in umbilical cable 77, it becomes feasible to design electromagnets 62 for higher current and lower voltage operation. Typical values for existing systems are 1.5 A phase current and 125Vdc-bus voltage. Typical values for the present invention are 4 A phase current and 48V dc-bus voltage. By restricting the maximum system voltage to 48V dc, the system falls under the Save Low Voltage directive of CE mark safety certification. The danger of hazardous shock is greatly reduced compared to existing systems on the market.

Amplifiers 64 and 66 operate with Pulse Width Modulation at moderate frequencies of 20–30 KHz. Amplifiers 64 are physically close to electromagnets 62, with total conductor length consisting of traces on circuit board 150 and wires in bundle 111 being about 20 cm. Referring to FIG. 4, amplifier 64a is shown sourcing current $i_a$ at potential $v_a$ to electromagnet 62a. Amplifier output voltage $v_a$ is a PWM signal while phase current $i_a$ is a synthesized waveform typically between DC and 1 KHz. As shown in FIG. 5B, Case 59 and cover plate 71 enclose all active electronic components of controller 60, resulting in very low radiated emissions compared with existing systems. Amplifiers 64 and 66 do not require output voltage filters and operate at moderate PWM frequency resulting in improved system power efficiency. Amplifier output voltage filters add significant phase lag to current control loops, which degrades system performance, hence eliminating these elements improves dynamic response. Improved system power efficiency also allows users to select smaller external power supplies thus decreasing overall cost.

Microprocessor 65 with digital logic circuit 148 provides an interface for sensors 63a and 63b directly in the same electronics that implements the motor control algorithms. This eliminates a separate sensor electronics circuit found in existing systems. The present invention also eliminates the communication latency between sensor electronics, and the motion control microprocessor found in existing systems. Elimination of such feedback latency allows improved motion control dynamics.

The electronics of the present invention is implemented substantially as a single circuit board 150 with plug-in amplifiers. The single circuit board replaces the multiple circuit boards and interconnection cabling and packaging hardware found in existing systems. This not only reduces cost, but substantially increases the system reliability as well. Use of plug-in amplifiers adds some system complexity due to increased interconnects, but this is offset by the flexibility of matching a common footprint amplifier to different motor phase types. A single design of circuit board 150 may be used with either 2/4-phase or 3-phase Sawyer forcers. External motors which applications might require may be any one of the common motor types: brush DC, brushless DC/AC servo or steppermotor. External motors may be either rotary or linear types. Power amplifiers are one of the most likely electronic components to fail due to stressed operation such as short circuits. Plug-in amplifiers thus enable quick and low cost repairs if an amplifier fails, as the individual amplifier may be easily replaced.

Additional Embodiments—FIG. 7

An additional embodiment of a portion of the present invention is shown in FIG. 7. A controller 200 consists of a single printed circuit board (PCB) 201 containing all the control elements of the controller 60 of FIG. 3. A connector 203 is mounted to circuit board 201 to provide electrical connection with an umbilical cable (not shown). A set of three connectors 210a, 210b, and 210c are mounted to PCB 201 to provide electrical connection with optional external motors (not shown). A set of mounting standoffs and screws, one of which is shown at 202 are provided to attach PCB 201 to a forcer cover plate (not shown). An input filter 204, a bank of capacitors 205 and a power relay 206 provide a controlled energy storage system for bulk 48V-dc power supplied via connector 203. A DC to DC converter circuit 207 provides logic level voltages from bulk 48V-dc power as required by logic circuits on PCB 201. A connector header 209 provides electrical connection for a sensor cable (not shown). A connector header 208 provides electrical connection for a fan cable (not shown). A connector header 226 provides electrical connection for motor phase leads (not shown). An integrated circuit 211 provides a communication interface between circuit board 201 and two or more communication conductors in connector 203.

The overall dimensions of circuit board 201, and the location of mounting screws and standoffs such as 202 are substantially the same as those of circuit board 150 of FIG. 5B. Connectors 203, 210a, 210b, and 210c, connector headers 207, 209, and 226, filter 204, capacitor bank 205, relay 206, DC converter 207, and communication circuit 211 are substantially the same as the corresponding elements of circuit board 150 of FIG. 5B.

A microprocessor 213 is electrically connected to communication circuit 211 and to a digital logic circuit 214. Digital logic circuit 214 is typically a FPGA. A multi-channel high-speed Analog to Digital Converter (ADC) 215 is electrically connected to digital logic circuit 214. An array 216 of 25 identical power circuits is provided on PCB 201. Each power circuit of array 216 consists of a pair of MOSFET power transistors such as 217 and 218, a MOSFET gate driver integrated circuit such as 219, a current sense resistor such as 220, and an analog amplifier with Sample and Hold (S/H) circuit such as 221. These components are connected via traces on PCB 201 in the well-known "T-bridge" amplifier circuit. Gate driver 219 is electrically connected to logic IC 214 and to the gate terminals of MOSFETs 217 and 218. Sense resistor 220 is electrically connected to the drain terminal of MOSFET 218 and ground. S/H circuit 221 is electrically connected to sense resistor 220 and ADC 215.

Components of T-bridge power circuits 216, ADC 215, logic circuit 214 and microprocessor 213 are low profile surface mount components that project about 1.5 mm above the surface of PCB 201. An array of threaded standoffs, one of which is shown at 225, is press fit to circuit board 201. A finned heatsink 222, shown in cut-away, sandwiches a compressible thermally conductive pad 223 between itself and the tops of all low profile components and is attached to PCB 201 using screws such as 224 threaded into the standoffs such as 225.

Operation—FIG. 7

The operation of elements of PCB 201 is functionally similar to the corresponding elements of PCB 150 of FIG. 5B, previously described, accept for the amplifiers. The significant difference is that the discrete plug-in amplifiers of circuit board 150 have been replaced with 25 individual T-bridge power stages 216. Whereas microprocessor 65 of circuit board 150 communicated command current values to amplifiers 64 and 66, which then implemented the current control internally, microprocessor 213, in conjunction with ADC 215 and portions of logic circuit 214 must provide the control of T-bridges 216. This places a significant additional computational burden on processor 214. The algorithms for implementing digital current control in processor 213 are substantially similar to the algorithms that are used in amplifiers 64 and 66 of FIG. 5B and are well known in prior art.

Digital logic circuit 214 implements a PWM generator for each T-bridge in array 216. Each PWM generator has an associated count register in IC 214 that determines the duty cycle of the output PWM waveform. Each PWM generator of circuit 214 outputs two non-overlapping control signals to connected gate drivers such as 219. Gate drivers, such as 219, convert the logic levels output by circuit 214 to current and voltage levels required for rapid switching of MOSFETs such as 217 and 218. Current flowing through MOSFETs such as 218 is sensed in resistors such as 220 and converted to a voltage. This voltage is sampled and amplified by S/H amplifiers such as 221, which connect to ADC 215. ADC 215 converts these analog signals into digital values and stores the results in register buffers in IC 214. The fundamental PWM frequency is typically 20–30 KHz and is set by a programmable counter circuit in IC 214.

Once or twice per PWM period, microprocessor 213 reads the ADC result registers of IC 214, executes a digital current control algorithm based on the desired motor phase currents and outputs a PWM count value to the associated count register in IC 214. If the update is performed once per PWM period, the mode of operation is known as single-update mode. Updating the PWM count register twice per PWM period is known as double-update mode. Double update allows higher control performance, but requires approximately twice the CPU computational time as single update. Algorithms for single-update or double-update digital current control are well know in prior art.

Heat generated from components under heatsink 222 is conducted by pad 223 to heatsink 222. Fins of heatsink 222 project into the interior cavity of a forcer such as 58 of FIG. 6 (not shown) where airflow from the forcer's fans will remove the heat.

The embodiment of the present invention shown in FIG. 7 is cheaper to manufacture then the embodiment shown in FIG. 5B since the cost of plug-in amplifiers is greater than the cost of implementing the power stages directly on circuit board 201. In addition, the configuration of FIG. 7 has lower mass and lower power dissipation and high theoretical reliability. These advantages are somewhat offset by the lack of flexibility in configuring circuit board 201 for different motor phase types. Although circuit board 201 is constructed for a total of 25 T-bridges 216, it may be manufactured by only partially populating these circuits. If circuit board 201 is used with a 2/4-phase Sawyer motor, 16 T-bridges are required. This leaves 9 T-bridges maximum for external motors allowing control of three 3-phase motors. If circuit board 201 is used with a 3-phase Sawyer motor such as shown in FIG. 5B, 12 T-bridges are required leaving up to 13 T-bridges for external motors allowing control of three 2/4-phase stepper motors. The minimum required number of T-bridges might be populated when assembling circuit board 201 in order to minimize cost, mass, and power dissipation. A further disadvantage of this embodiment is that destruction of a single amplifier T-bridge may result in scrapping the entire control board 201.

Additional Embodiments—FIG. 8

FIG. 8 shows an embodiment of a controller 250 similar to the configuration of controller 200 of FIG. 7. A control board 251 is shown having identical components to FIG. 7 accept the array of 25 T-bridges 216 has been replaced with a multi-chip hybrid package 266. Within multi-chip hybrid package 266 are 25 T-bridge circuits (not shown) implemented with bare dice semiconductor components and wire bonding techniques. Hybrid package 266 is provided with a heatsink 267 to extract heat from the active components. Hybrid package 266 has signal and electrical interface requirements substantially identical to 25 T-bridge array 216 of FIG. 7.

Operation—FIG. 8

The elements of controller 250 of FIG. 8 function identically to the corresponding elements of controller 200 of FIG. 7. The principle advantage of this embodiment of the present invention is a decrease in mass and a reduction in size of the T-bridge components. This is offset by increased cost and loss of configuration for different motor phase types and repair difficulty as noted in the embodiment of FIG. 7 above.

Alternate Embodiments—FIGS. 9A, 9B

FIG. 9A shows a partially exploded perspective view of an alternate embodiment of the present invention. A Sawyer forcer 300 has a sidewall 301 provided with a connector 302, an air port with sealing O-ring 303, and a set of threaded holes one of which is shown at 304. Internal to forcer 300, connector 302 is wired (not shown) to electromagnets and feedback sensors better seen in FIG. 9B.

A separately housed, detachable controller 306 attaches to forcer 300 using screws such as 314 mounted in a tab 313 and which thread into hole 304. When controller 306 is attached to forcer 300, a connector (not shown) and air port (not shown) on controller 306 mate with connector 302 and air port 303 of forcer 300. A finned housing 315 of controller 306 may be formed from anodized extruded or machined aluminum. A top surface 307 of housing 315 has a connector 309 and an air port with sealing O-ring 308 designed to mate with an umbilical and associated connector housing 305. A set of three connectors, one of which is shown at 310 is provided for connecting optional external motors or I/O (not shown).

Internal to case 315 (not shown) are all the components previously disclosed for controller 60 of FIG. 5B, or controller 200 of FIG. 7 or controller 250 of FIG. 8. All heat generating components of controller 306 are located adjacent to the finned surfaces of case 315 which function to dissipate heat to the surrounding air. On a side surface 311 of controller 306 a small fan 312 is mounted. On an opposite side surface 316 is mounted a small fan 317 shown in FIG. 9B. Fan 312 induces air from outside case 315 to flow inside case 315, while fan 317 induces air from inside case 315 to flow outside case 315. Fans 312 and 317 thus work cooperatively to cool the internal components of case 315.

FIG. 9B shows the same embodiment from the bottom. Four electromagnet linear motor segments, 320, 321, 322 and 323 are visible on forcer 300. The electromagnet segments are shown for a 2/4-phase Sawyer forcer. A central region of forcer 300 is equipped with four sensors, 324, 325, 326, and 327 for sensing forcer dynamic motion parameters such as position, velocity, or acceleration. The design of electromagnets and sensors are well known in prior art.

Operation—FIGS. 9A, 9B

The embodiment shown in FIGS. 9A and 9B operates in an identical fashion to the prior described embodiments. This embodiment differs only in that the electronic elements have been packaged in a removable case rather than within the cavity of forcer 300. Accordingly, this embodiment provides some advantages and disadvantages when compared to the prior described embodiments.

The primary advantage is that the bulk of the interior cavity of forcer 300 is now available for other use. This is sometimes an important advantage since it allows more compact mechanical systems for additional axes. An additional advantage is that controller 306 may be designed to work with standard Sawyer forcers provided by a number of manufactures, rather than using a forcer with a custom case designed specifically for integrating the controls as in the preferred embodiment of FIG. 5B. The location and style of connectors 302, and air port 303 may vary by manufacturer, requiring modification of case 315 and the location of mating connectors and air ports as needed.

CONCLUSION, RAMIFICATIONS, AND SCOPE

Accordingly, the reader will see that the Sawyer forcer with integrated controller of the invention provides greatly improved efficiency, safety, reliability, and performance, while decreasing system cost. Integration of control electronics within the forcer or attached to one or more surfaces of it, results in the following benefits it replaces rapidly varying voltage and current waveforms in umbilical cable conductors with DC or quasi-DC waveforms greatly reducing electromagnetic emissions;

it reduces the number of conductors in umbilical cables from 30–50 for existing systems to 4–10 for new systems, decreasing umbilical mass and cost;

it eliminates power dissipation due to resistive loss of phase current circulation in the umbilical cable since amplifiers are mounted in close proximity to electromagnets, increasing system power efficiency;

it increases power efficiency by utilizing low frequency PWM amplifiers without output filters made possible by enclosing the amplifiers and electromagnets within a common metallic enclosure.

it reduces system susceptibility to external electromagnetic interference by enclosing all of the system electronics within a single metallic enclosure with a limited number of input conductors;

it enables low voltage 48Vdc designs greatly improving system safety and enabling easier safety certification of systems;

it improves control system performance by decreasing feedback signal latency compared to existing systems which convert and transmit sensor data from a forcer to a remote controller;

it improves control system performance by eliminating the phase shift caused by amplifier output voltage filters on existing systems;

it improves reliability by consolidating all control electronics onto a single PCB, thus eliminating many interconnections, which are prone to contact failure;

it reduces system cost by eliminating external controller cabinet hardware, consolidating electronics onto a single PCB, and enabling a smaller power supply due to increased system efficiency;

it provides a straight forward, low cost method of controlling additional motor axes which are often required in assembly systems.

Although the description above provides detailed specifications of several presently preferred embodiments of this invention, these should not be construed as limiting the scope of the invention. A wide selection of electronic components from many manufactures may be used to design controllers. Many variations of forcer case designs and electromagnet designs are known. Numerous sensor designs are known for incorporation in forcers. Countless variations and permutations of these components may be combined to produce alternate embodiments of this invention by one of ordinary skill in the art. For example, a forcer may contain a single linear motor segment for operation in a single axis, and may be supported by linear ball bearings rather than air bearings. A controller for such a forcer would have fewer amplifiers than the embodiments described above. A controller might be implemented on multiple printed circuit boards disposed around the sidewalls of a forcer to enable alternate use of the central cavity, in which case the exterior sidewalls might be equipped with heatsink fins to dissipate heat from the forcer to external air. A controller might be mounted in an enlarged housing on the end of the umbilical and be permanently attached to the umbilical while being removable attached to the forcer. The various components of a controller might be partitioned amongst several printed circuit boards, with some located within the forcer case, some mounted external to the forcer, and some attached to the umbilical end. Such configurations would still be functionally equivalent to the embodiments disclosed above.

I claim:

1. A digitally controlled, integrated Sawyer motor forcer comprising, a rigid body housing one or more linear motor segments aligned in one or more directions on a first surface of said rigid body, said one or more linear motor segments each comprising one or more toothed electromagnets, said one or more toothed electromagnets being provided with an electrical interconnection means for coupling electrical power to said one or more toothed electromagnets, and an electronic controller affixed to said rigid body, said electronic controller including a microprocessor circuit, a communication interface circuit, a power supply circuit, and a amplifier circuit, said amplifier circuit being electrically connected to said one or more toothed electromagnets by said electrical interconnection means, said power supply circuit being in electrical connection with said amplifier circuit, said microprocessor circuit being in data communication with said amplifier circuit, said microprocessor circuit being equipped with control programs for selectively controlling said amplifier circuit to regulate the flow of electricity in said one or more toothed electromagnets, said communication interface circuit being in data communication with an external controller or computer system and being in electrical communication with said microprocessor circuit providing means for said microprocessor circuit to communicate with an external controller for the purpose of accepting commands to govern the behavior of said rigid body and to report the operational condition or status of said rigid body, and an interface means for connecting said rigid body and said electronic controller to an external source of electrical power, said interface means containing at least a pair of power conductors for providing electrical power to said power supply circuit of said electronic controller.

2. The device of claim 1, said electronic controller further including an EMI filter disposed between said pair of power conductors and a bank of at least one capacitor, thereby functioning as a filter to suppress current and voltage ripple on said pair of power conductors in said interface means, whereby high-frequency voltage and current fluctuations are confined to said electronic controller and said one or more toothed electromagnets.

3. The device of claim 2, wherein said electronic controller consists of a printed circuit board containing said microprocessor circuit, said communication interface circuit, said power supply circuit, said EMI filter, and the capacitor bank, further including a plurality of connectors disposed on a first surface of said printed circuit board, said plurality of connectors providing a mechanical and an electrical interface for one or more removable amplifier circuits, said microprocessor circuit being in data communication with said one or more removable amplifier circuits and said one or more toothed electromagnets being in electrical connection with said one or more removable amplifier circuits, whereby said microprocessor circuit may effect electrical control of said one or more toothed electromagnets.

4. The device of claim 3, further including one or more motion sensors affixed to said rigid body, said one or more motion sensors being in electrical communication with said microprocessor circuit of said electronic controller, said microprocessor circuit being further equipped with control programs for computing motion parameters of said rigid body including at least position, whereby said microprocessor circuit may effect closed-loop control of said rigid body.

5. The device of claim 4, further including one or more additional removable amplifier circuits disposed on said first surface of said printed circuit board in electrical and mechanical connection with said plurality of connectors, said one or more additional removable amplifier circuits being in data communication with said microprocessor circuit, said printed circuit board further including one or more external motor electrical connectors, said one or more external motor electrical connectors being in electrical connection with said one or more additional removable amplifier circuits and said microprocessor circuit, said one or more external motor electrical connectors providing electrical connections for one or more external motors and one or more external I/O devices, said microprocessor circuit further including control programs for controlling said external motors through motive power supplied by said one or more additional removable amplifiers.

6. The device of claim 5, further including a cavity disposed on a second surface of said rigid body, said cavity being suitably sized to contain said electronic controller within said cavity, said rigid body further including a cover plate suitably sized to cover said cavity on said second surface, said cover plate removable attached to said rigid body, and said electronic controller removable affixed to a surface of said cover plate facing the interior of said cavity, whereby said electronic controller is enclosed within said cavity by said cover plate.

7. The device of claim 6, further including one or more finned heatsinks affixed to heat generating components of said electronic controller and said rigid body on surfaces facing the interior of said cavity, said rigid body further including one or more small openings connecting the interior of said cavity with the exterior of said rigid body, said one or more small openings being provided with one or more electric fans, said one or more electric fans being in electrical connection with said power supply circuit, whereby cooling air is urged through said cavity and flows past said finned heatsinks cooling said electronic controller and said rigid body.

8. The device of claim 5, further including mounting means for securely affixing said electronic controller externally to one or more surfaces of said rigid body, said rigid body further including one or more electrical connectors disposed on at least one surface of said rigid body, said one or more electrical connectors being in electrical communication with said one or more toothed electromagnets and said one or more motion sensors, said mounting means providing an electrical connection between said electronic controller and said one or more electrical connectors, whereby said electronic controller may regulate the flow of electricity through said one or more toothed electromagnets of said rigid body.

9. The device of claim 2, wherein said electronic controller consists of said microprocessor circuit, said communication interface circuit, said power supply circuit, said EMI filter, the capacitor bank, and said amplifier circuit on substantially a single printed circuit board, said single printed circuit board being in electrical connection with said one or more toothed electromagnets, whereby said microprocessor circuit may effect electrical control of said one or more toothed electromagnets.

10. The device of claim 9, further including one or more motion sensors affixed to said rigid body, said motion sensors being in electrical communication with said microprocessor circuit of said electronic controller, said microprocessor circuit being further equipped with control programs for computing motion parameters of said rigid body including at least position, whereby said microprocessor circuit may effect closed-loop control of said rigid body.

11. The device of claim 10, further including one or more additional amplifier circuits disposed on said single printed circuit board, said one or more additional amplifier circuits being in data communication with said microprocessor circuit, said single printed circuit board further including one or more external motor electrical connectors, said one or more external motor electrical connectors being in electrical connection with said one or more additional amplifier circuits and said microprocessor circuit, said one or more external motor electrical connectors providing electrical connections for one or more external motors and one or more external I/O devices, said microprocessor circuit further including control programs for controlling said one or more external motors through motive power supplied by said one or more additional amplifier circuits.

12. The device of claim 11, further including a cavity disposed on a second surface of said rigid body, said cavity being suitably sized to contain said electronic controller within said cavity, said rigid body further including a cover plate suitably sized to cover said cavity on said second surface, said cover plate removable attached to said rigid body, said rigid body and said cover plate being made of an electrically conductive material provided with an electrically insulating surface such as anodized aluminum, said electronic controller removable affixed to a surface of said cover plate facing the interior of said cavity, whereby said electronic controller is enclosed within said cavity by said cover plate.

13. The device of claim 12, further including one or more finned heatsinks affixed to heat generating components of said electronic controller and said rigid body on surfaces facing the interior of said cavity, said rigid body further including one or more small openings connecting the interior of said cavity with the exterior of said rigid body, said one or more small openings being provided with one or more electric fans, said one or more electric fans being in electrical connection with said power supply circuit, whereby cooling air is urged through said cavity and flows past said finned heatsinks cooling said electronic controller and said rigid body.

14. The device of claim 11, further including mounting means for securely affixing said electronic controller externally to one or more surfaces of said rigid body, said rigid body further including one or more electrical connectors disposed on at least one surface of said rigid body, said one or more electrical connectors being in electrical communication with said one or more toothed electromagnets and said one or more motion sensors, said mounting means providing an electrical connection between said electronic controller and said one or more electrical connectors, whereby said electronic controller may regulate the flow of electricity through said one or more toothed electromagnets of said rigid body.

15. A digitally controlled, integrated 3-phase planar Sawyer motor forcer comprising,
   a 3-phase planar Sawyer motor forcer comprising a rigid body having a first surface containing a first linear motor segment aligned in a first direction, a second linear motor segment aligned in said first direction, said second linear motor segment being offset in a second direction from said first linear motor segment, a third linear motor segment aligned in said second direction, a fourth linear motor segment aligned in said second direction, said fourth linear motor segment being offset in said first direction from said third linear motor segment, each of said first linear motor segment, said second linear motor segment, said third linear motor segment, and said fourth linear motor segment comprising three toothed electromagnets for a total of 12 toothed electromagnets contained in said first surface of said rigid body, said rigid body being equipped with a bearing means for moveably supporting said first surface a small distance away from any flat object placed proximate to said first surface, and an electronic controller affixed to said rigid body, said electronic controller including a microprocessor circuit, a communication interface circuit, a power supply circuit, and an amplifier circuit, said amplifier circuit being electrically connected to said 12 toothed electromagnets, said power supply circuit being in electrical connection with said amplifier circuit, said microprocessor circuit being in data communication with said amplifier circuit, said microprocessor circuit being equipped with control programs for selectively controlling said amplifier circuit to regulate the flow of electricity in said 12 toothed electromagnets, said communication interface circuit being in data communication with an external controller or computer system and being in electrical communication with said microprocessor circuit providing means for said microprocessor circuit to communicate with an external controller for the purpose of accepting commands to govern the behavior of said rigid body and to report the operational condition or status of said rigid body, and an interface means for connecting said rigid body and said electronic controller to an external source of electrical power, said interface means containing at least a pair of power conductors for providing electrical power to said power supply circuit of said electronic controller.

16. The device of claim 15, said electronic controller consisting of one or more printed circuit boards containing said microprocessor circuit, said communication interface circuit, said power supply circuit, and said amplifier circuit, said electronic controller further including an EMI filter disposed between said pair of power conductors and a bank of at least one capacitor, thereby functioning as a filter to suppress current and voltage ripple on said pair of power conductors in said interface means, whereby high-frequency voltage and current fluctuations are confined to said electronic controller and said 12 toothed electromagnets.

17. The device of claim 16, said amplifier circuit comprising at least a first set of 12 T-bridge amplifiers, said first set of 12 T-bridge amplifiers being in electrical connection with said 12 toothed electromagnets, whereby said electronic controller may control the flow of electricity in said 12 toothed electromagnets.

18. The device of claim 17, further including one or more motion sensors affixed to said rigid body, said motion sensors being in electrical communication with said microprocessor circuit of said electronic controller, said microprocessor circuit being further equipped with a control program for computing motion parameters of said rigid body including at least position, whereby said microprocessor circuit may effect closed-loop control of said rigid body.

19. The device of claim 18, said amplifier circuit further including at least a second set of two or more T-bridge amplifiers, said second set of two or more T-bridge amplifiers being in data communication with said microprocessor circuit, said electronic controller further including at least one or more external motor connectors, said one or more external motor connectors being in electrical connection with said set of two or more T-bridge amplifiers, whereby said electronic controller may effect motive control of one or more external motors which may be affixed to said rigid body.

20. The device of claim 19, further including a cavity disposed on a second surface of said rigid body, said cavity being suitably sized to contain said electronic controller within said cavity, said rigid body further including a cover plate suitably sized to cover said cavity on said second surface, said cover plate removable attached to said rigid body, said rigid body and said cover plate being made of an electrically conductive material provided with an electrically insulating surface such as anodized aluminum, said electronic controller removable affixed to a surface of said cover plate facing the interior of said cavity, and further including one or more finned heatsinks affixed to heat generating components of said electronic controller and said rigid body on surfaces facing the interior of said cavity, said rigid body further including one or more small openings connecting the interior of said cavity with the exterior of said rigid body, said one or more small openings being provided with one or more electric fans, said one or more electric fans being in electrical connection with said power supply circuit, whereby cooling air is urged through said cavity and flows past said one or more finned heatsinks cooling said electronic controller and said rigid body.

* * * * *